United States Patent
Boydston et al.

(10) Patent No.: US 6,703,290 B2
(45) Date of Patent: Mar. 9, 2004

(54) GROWTH OF EPITAXIAL SEMICONDUCTOR MATERIAL WITH IMPROVED CRYSTALLOGRAPHIC PROPERTIES

(75) Inventors: Mark R. Boydston, Vancouver, WA (US); Oleg V. Kononchuk, Brush Prairie, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 10/319,999

(22) Filed: Dec. 16, 2002

(65) Prior Publication Data

US 2003/0109095 A1 Jun. 12, 2003

Related U.S. Application Data

(63) Continuation-in-part of application No. 09/735,026, filed on Dec. 11, 2000, now Pat. No. 6,506,667, which is a continuation of application No. 09/353,195, filed on Jul. 14, 1999, now Pat. No. 6,190,453.

(51) Int. Cl.[7] ............................................. H01L 21/20
(52) U.S. Cl. ........................................................ 438/503
(58) Field of Search ......................... 438/503, 505; 117/89, 93, 135

(56) References Cited

U.S. PATENT DOCUMENTS

| | | |
|---|---|---|
| 3,941,647 A | 3/1976 | Druminski |
| 3,945,864 A | 3/1976 | Goldsmith et al. |
| 4,859,626 A * | 8/1989 | Wise ........................... 438/505 |
| 5,110,757 A | 5/1992 | Arst et al. |
| 5,227,330 A | 7/1993 | Agnello et al. |
| 5,360,509 A | 11/1994 | Zakaluk et al. |
| 5,378,651 A | 1/1995 | Agnello et al. |
| 5,403,434 A | 4/1995 | Moslehi |
| 5,846,321 A | 12/1998 | Habuka et al. |
| 5,853,804 A | 12/1998 | Hansen |
| 6,124,209 A | 9/2000 | Habuka et al. |
| 6,190,453 B1 | 2/2001 | Boydston et al. |
| 2002/0022351 A1 | 2/2002 | Schmolke et al. |
| 2002/0025660 A1 | 2/2002 | Boydston et al. |

FOREIGN PATENT DOCUMENTS

| | | |
|---|---|---|
| EP | 0897192 A1 | 2/1999 |
| EP | 1 163 379 B1 | 3/2000 |
| WO | WO 97/28560 | 8/1997 |

OTHER PUBLICATIONS

Stanley Wolf Silicon Processing for the VSLI Era vol. 1 Lattice Press 1986 pp. 126,139.*
Stanley Wolf Silicon Processing for the VSLI Era vol. 2 Lattice Press 1990 pp. 512.*
Ghandi VSLI Fabrication Principles 2nd edition 1994.*
*VLSI Fabrication Principles Silicon and Gallium Arsenide Second Edition*, S. K. Ghandhi, Chapter 5, pp. 258–367, 1994.
*Silicon Processing for the VLSI Era vol. 1—Process Technology*, S. Wolf et al; Chapter 5, pp. 124–160, 1986.

* cited by examiner

*Primary Examiner*—Carl Whitehead, Jr.
*Assistant Examiner*—David S Blum
(74) *Attorney, Agent, or Firm*—Alston & Bird LLP

(57) ABSTRACT

A method of growing epitaxial semiconductor layers with reduced crystallographic defects. The method includes etching the wafer surface and then growing an initial portion of the epitaxial layer under conditions of relatively high temperature and low source gas flow to heal defects in or on the surface of the substrate. Subsequently, the remainder of the epitaxial layer is grown under high growth rate conditions resulting from high source gas flow. The initial portion of the epitaxial layer acts as a low-defect seed layer by preventing defects in the surface of the substrate from propagating into the remainder of the epitaxial layer. However, the relatively high source gas flow permits the remainder epitaxial layer to be grown at a faster rate than the initial portion of the epitaxial layer.

20 Claims, 4 Drawing Sheets

Temp = T₁

Temp = T₂ < T₁

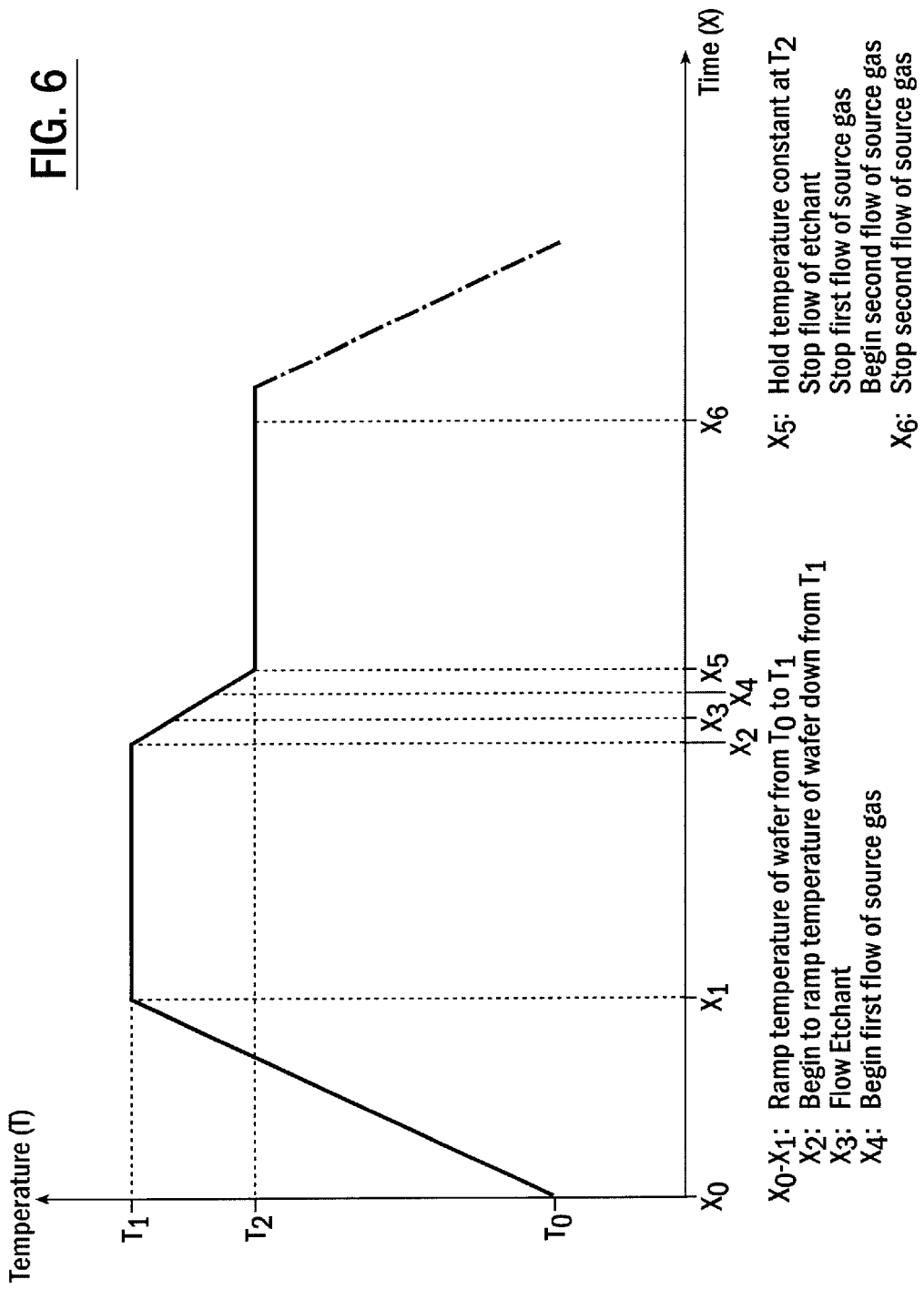

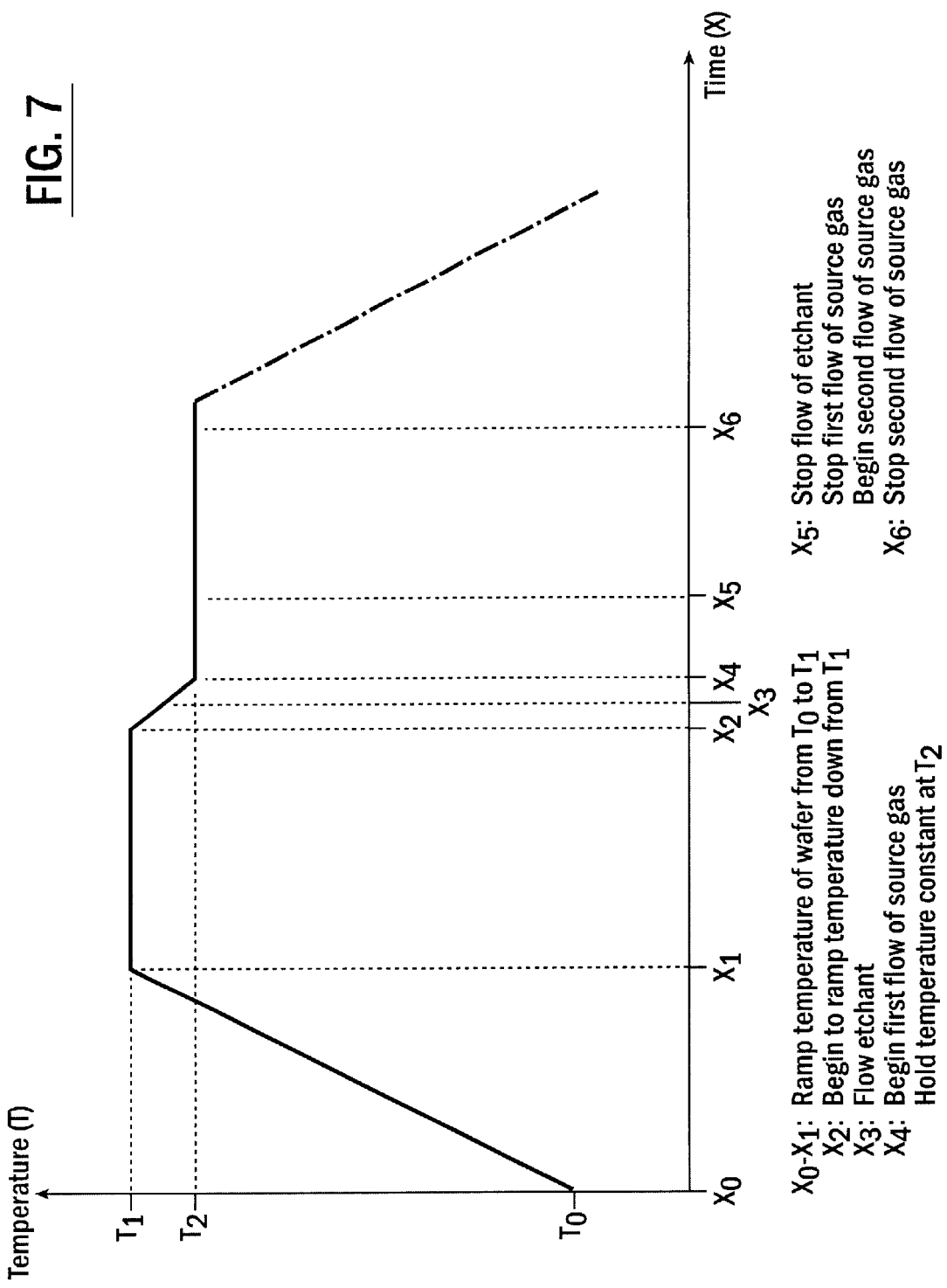

GROWTH OF EPITAXIAL SEMICONDUCTOR MATERIAL WITH IMPROVED CRYSTALLOGRAPHIC PROPERTIES

CROSS-REFERENCE TO RELATED APPLICATIONS

This application is a continuation-in-part of U.S. patent application Ser. No. 09/735,026, filed Dec. 11, 2000 now U.S. Pat. No. 6,506,667 which is a continuation of U.S. patent application Ser. No. 09/353,195, filed Jul. 14, 1999 and issued Feb. 20, 2001 as U.S. Pat. No. 6,190,453, the contents of all of which are incorporated herein in their entirety.

BACKGROUND OF THE INVENTION

The present invention relates to growth of epitaxial semiconductor layers, and more particularly to a process for growing an epitaxial semiconductor layer on a semiconductor substrate to reduce the number of crystallographic defects that propagate into the epitaxial layer from the substrate.

Integrated circuits have revolutionized virtually all areas of human activity. Although the processes for manufacturing integrated circuits are extremely complex and expensive, manufacturers have developed mass production techniques to reduce the costs per integrated circuit (unit cost) to a few dollars for most circuits. As a result, millions of integrated circuits are incorporated into a diverse array of consumer, industrial, and military products each year.

However, the integrated circuit manufacturing industry is one of the most competitive in the world. Even a small increase or decrease in a manufacturer's unit cost can have a dramatic impact on the manufacturer's profits or market share. To remain competitive in this market, integrated circuit manufacturers must continuously strive to reduce their unit cost by increasing both yield and throughput.

Yield is a measure of the number of integrated circuits that are free of fatal defects (i.e., defects which prevent the circuit from functioning properly). Integrated circuits are typically manufactured on semiconductor wafers. Depending on the relative sizes of the wafer and integrated circuit, a single wafer may contain from just a few, to hundreds of integrated circuits. Yield is usually expressed as the average percentage of integrated circuits per wafer, which are free of fatal defects. Yield may be measured at the end of a particular processing step, or may be measured at the end of the entire manufacturing process. In either case, a higher yield means that manufacturing costs are spread over a larger number of integrated circuits, thus reducing the unit cost.

Throughput is a measure of the number of integrated circuits which are manufactured in a particular time period. Throughput is sometimes expressed as the number of 'wafers per hour' which are cycled through a particular process such as an epitaxial reactor. If the throughput of an epitaxial reactor is increased, then fewer reactors are needed to process a given number of wafers, thus saving capital equipment expenditures and reducing the unit cost.

Unfortunately, yield and throughput can be conflicting goals. Modifications to the manufacturing process that are intended to increase throughput often result in lower yield, and vice versa. As a result, manufacturers typically must make compromises between maximum yield and maximum throughput to minimize their unit cost. One integrated circuit manufacturing process in which this yield versus throughput conflict arises is epitaxy.

Epitaxy generally involves the growth or deposition of a single-crystal layer of semiconductor material on the surface of a semiconductor substrate of the same material such that the epitaxial layer has the same crystal orientation as the underlying substrate. Many modern integrated circuits are formed in epitaxial semiconductor layers on a semiconductor substrate rather than in the substrate itself. Therefore, growth of high quality epitaxial layers at low cost is an important goal for many integrated circuit manufacturers.

Two important characteristics that determine the quality of an epitaxial layer, and thus the yield of the manufacturing process, are the number of crystallographic defects and the transition width. Crystallographic defects are non-uniformities in the crystal structure of the epitaxial layer. Many of these crystallographic defects are caused by defects or impurities in the substrate surface, which then propagate into the epitaxial layer during epitaxial growth. Stacking faults are a common example of such crystallographic defects, which can cause operating failures in circuits formed in the epitaxial layer. Thus, a reduction in these defects may increase yield.

The transition width describes the thickness of the region of the epitaxial layer adjacent the substrate where the dopant concentration is higher or lower than in the remainder of the epitaxial layer due to diffusion of dopants into and/or out of the substrate. If the transition width extends into the area of the epitaxial layer in which circuits are formed, the circuits may not function properly. Thus, a reduction in transition width may increase yield.

One of the most effective ways to reduce the cost of an epitaxy process step is to increase the throughput of the epitaxial reactor by increasing the growth rate of the epitaxial layer. A higher growth rate means reducing the time needed to grow an epitaxial layer of a particular thickness, which allows more wafers to be processed in a given time period.

However, increased growth rates typically lead to increased defects in the epitaxial layer. Further, one of the primary techniques for increasing the growth rate—raising the temperature of the substrate during growth—causes increased dopant diffusion, thereby increasing the transition width. As a result, manufacturers often must compromise between high throughput and high yield to minimize their unit costs.

Therefore, it would be desirable to have a process for growing an epitaxial semiconductor layer at a high growth rate to improve throughput, while also improving yield by reducing the number of crystallographic defects and the transition width. Such a process could significantly reduce a manufacturer's unit cost.

BRIEF SUMMARY OF THE INVENTION

The invention provides a method of growing epitaxial semiconductor layers with reduced crystallographic defects while maintaining or improving throughput and maintaining or reducing transition width. As a result of the process conditions under which the epitaxial layer is grown, an initial portion of the epitaxial layer serves to cover or occlude defects in the surface of the substrate and therefore acts as a low-defect seed layer by preventing defects in the surface of the substrate from propagating into the remainder of the epitaxial layer. The remainder of the epitaxial layer may therefore have the thickness and dopant concentration required for a particular integrated circuit manufacturing process, but it is protected from many defects that might otherwise propagate thereinto from the surface of the substrate by the initial portion of the epitaxial layer. As a result, the method of the present invention may advantageously increase the yield without reducing the throughput.

According to the present invention, the epitaxial layer is initially grown on the surface of the semiconductor substrate at a first growth rate, prior to altering the process conditions and growing the remainder of the epitaxial layer at a second growth rate that equals or exceeds the first growth rate. By initially growing the epitaxial layer at a slower growth rate, defects in the semiconductor substrate may be masked by an initial portion of the epitaxial layer that is grown somewhat slowly and is of relatively high quality. Thereafter, the growth rate may be increased and the majority of the epitaxial layer may be deposited at the higher growth rate so as to increase the overall efficiency of the epitaxial deposition process while continuing to build upon the initial portion of the epitaxial layer that is of relatively high quality.

The method of the present invention may also etch the semiconductor substrate prior to and/or during the growth of the initial portion of the epitaxial layer in order to reduce the defects in the semiconductor substrate and to correspondingly reduce propagation of those defects throughout the epitaxial layer. The etching of the semiconductor substrate and/or the initial portion of the epitaxial layer is at least reduced and, more commonly, eliminated during the growth of the remainder of the epitaxial layer at the increased growth rate.

According to one embodiment, the semiconductor substrate may be maintained at a constant temperature while etching the semiconductor substrate and growing the entire epitaxial layer. Alternatively, the temperature of the semiconductor substrate may be decreased during the etching of the semiconductor substrate and/or during the growth of the initial portion of the epitaxial layer. As such, the continued growth of the epitaxial layer may be at a lower temperature than that at which at least a portion of the epitaxial layer is initially grown.

The flow rate of the source gas that is passed over the semiconductor substrate during the epitaxial growth process may be increased following the growth of the initial portion of the epitaxial layer while the remainder of the epitaxial layer is grown. As such, the continued growth of the epitaxial layer may proceed at a growth rate that is greater than the rate at which the initial portion of the epitaxial layer was grown, even though the temperature has been decreased in some embodiments. Thus, the method of the present invention provides the twin benefits of effectively covering the defects in the semiconductor substrate with a relatively high purity epitaxial layer that is grown somewhat slowly and then growing the majority of the epitaxial layer at a much greater growth rate, thereby increasing the overall efficiency of the epitaxial deposition process.

The method of the present invention may also remove oxide from the semiconductor substrate prior to growth of the epitaxial layer. In this regard, the oxide may be removed by baking the semiconductor substrate or by exposing the semiconductor substrate to an etchant containing hydrofluoric acid. Following the completion of the growth of the epitaxial layer, an oxide layer may be grown thereupon for protection, if desired. Both the pre-epitaxial oxide removal and the post-epitaxial oxide deposition may occur within or exterior to the epitaxial chamber.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 6 is a graph of the process steps for operating an epitaxial reactor corresponding to the method of FIG. 5; and FIG. 7 is a graph of the process steps for operating an epitaxial reactor according to another embodiment of the present invention.

DETAILED DESCRIPTION OF THE INVENTION

Figure 1:
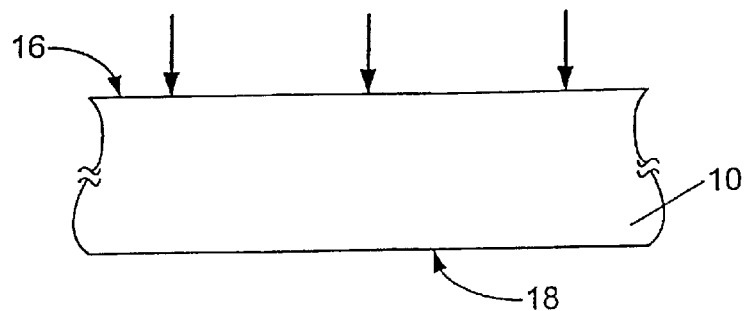
FIG. 1 is a fragmentary, cross-sectional view of a semiconductor wafer during growth of an initial portion of the epitaxial layer according to one embodiment of the present invention.
Figure 2:
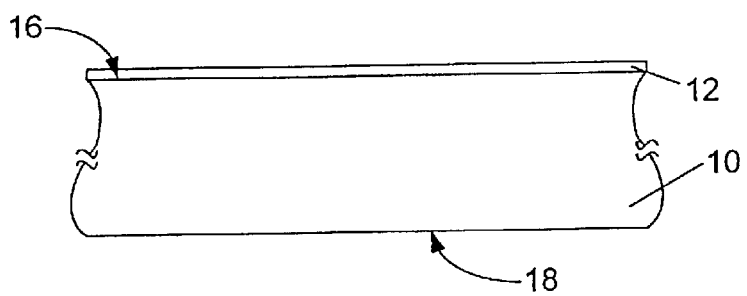
FIG. 2 is a fragmentary, cross-sectional view of the semiconductor wafer of FIG. 1 showing the initial portion of the epitaxial layer on the surface of the substrate.
Figure 3:
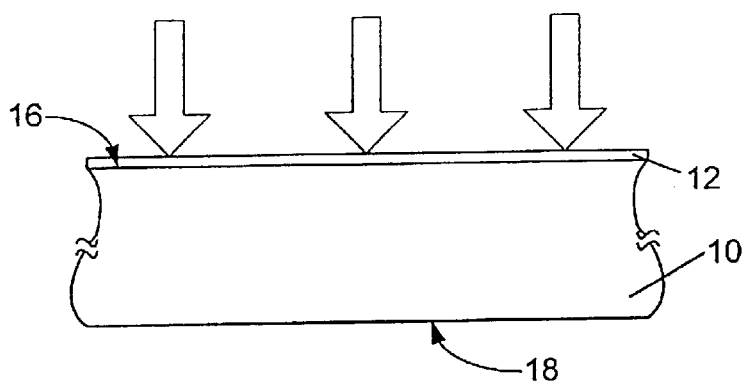
FIG. 3 is a fragmentary, cross-sectional view of the semiconductor wafer of FIG. 2 during growth of the remainder of the epitaxial layer according to one embodiment of the present invention.
Figure 4:
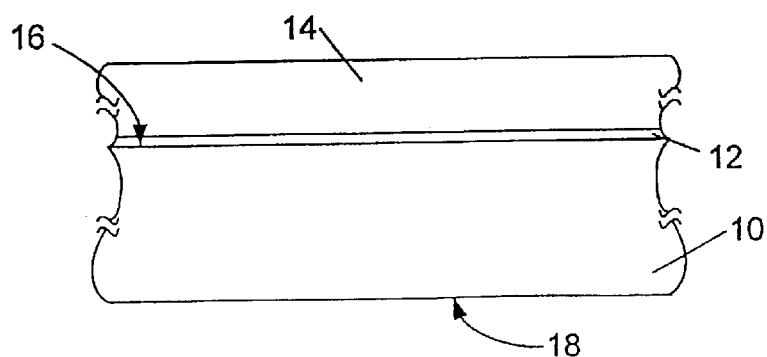
FIG. 4 is a fragmentary, cross-sectional view of the semiconductor wafer of FIG. 3 showing the remainder of the epitaxial layer on the initial portion of the epitaxial layer.

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIGS. 1–4 illustrate a semiconductor substrate 10 undergoing a process for growing epitaxial semiconductor material with improved crystallographic properties according to one embodiment of the present invention. In one process step, an initial portion of an epitaxial layer of semiconductor material 12 (also referred to herein as a 'seed layer') is grown on a surface of substrate 10 to cover crystallographic defects in the surface. In a subsequent process step, the remainder of the epitaxial layer of semiconductor material 14 is grown thereon under somewhat different process conditions. The initial portion of the epitaxial layer prevents at least some of the crystallographic defects in the surface from propagating into the remainder of the epitaxial layer.

Substrate 10 may be a silicon wafer undergoing growth of silicon epitaxial layers. However, those of skill in the art will appreciate that there are other semiconductor substrates and materials which are suitable for processing in accordance with the present invention. Therefore, while the description below refers to substrate 10 as a silicon wafer and to the epitaxial layer as a silicon epitaxial layer, it will be understood that the method of the present invention is equally applicable to other semiconductor substrates and materials.

Silicon wafer 10 is usually a single crystal structure with a front surface 16 aligned substantially along the primary crystal plane. Front surface 16 is typically highly polished to form a relatively planar surface. Back surface 18, which is substantially parallel to front surface 16, may also be polished, or may be comparatively rough or irregular. Wafer 10 is generally in the shape of a circular disk having a diameter and thickness which conform to prescribed standards within the integrated circuit manufacturing industry. For example, many manufacturers currently use silicon wafers having a diameter of approximately 200 mm and a thickness of approximately 0.725 mm. However, it will be appreciated that wafer 10 may have a different diameter or thickness, or may be in a form other than a circular disk.

Wafer 10 typically has some relatively significant concentration of dopant atoms within the crystal lattice to impart a desired resistivity to the wafer. The dopant species may be an acceptor, such as boron, or a donor, such as phosphorus, arsenic, or antimony. In any event, wafer 10 acts as a single-crystal base on which single-crystal epitaxial layers can be grown. As discussed in more detail below, these epitaxial layers may have the same dopant concentrations and species as wafer 10, or they may have different dopant concentrations and/or dopant species.

Although front surface 16 is typically highly polished and cleaned to remove most defects and impurities, it is virtually impossible to provide a perfect single-crystal surface on which to grow an epitaxial layer. Thus, for example, front surface 16 may include a variety of imperfections such as scratches, oxygen precipitates, and agglomerations of native point defects, as well as contaminants including metals, organic materials, etc., all within or on the surface of the wafer. These surface imperfections, found on the front surface 16 of wafer 10, are hereinafter referred to collectively as defects. In addition, it will be appreciated that similar defects will ordinarily be present on back surface 18. Indeed, in the embodiment in which back surface 18 is unpolished, many more defects will typically be present than in front surface 16.

The epitaxial layer 12,14 may be formed using any of several standard epitaxy processes. A method for forming the epitaxial layer in accordance with the present invention by a process known as vapor phase epitaxy is indicated generally at 100 in FIG. 5. Vapor phase epitaxy may be conducted at atmospheric pressure or at a pressure above or below atmospheric pressure. The method involves, at step 110, placing one or more semiconductor substrates, such as silicon wafer 10, in an epitaxial reaction chamber configured for growing epitaxial semiconductor layers on semiconductor substrates.

Subsequently, at step 120, the temperature of wafer 10 is adjusted to a first temperature, such as a temperature suitable for epitaxial silicon growth. Typically, the first temperature is in the range of 1000 to 1200 degrees Celsius. In one embodiment, the first temperature is 1150 degrees Celsius. However, those of skill in the art will appreciate that the first temperature will vary depending on a variety of factors including the pressure within the reaction chamber and the reactant source gas used. In this regard, while the reaction chamber may be subjected to different pressures, the reaction chamber may be pressurized to 1 atmosphere in accordance with one embodiment of the present invention. FIG. 6 is a temperature versus time graph corresponding to the method of FIG. 5, and illustrating a sequence of steps carried out in an epitaxial reaction chamber according to one embodiment of the present invention. As depicted in FIG. 6, the temperature of wafer 10 is usually changed gradually, or 'ramped,' from a nominal temperature $T_0$, at a time $X_0$, to a higher temperature $T_1$, at a time $X_1$.

Initially, the native oxide that has generally formed upon the wafer 10 is preferably removed as described below. Thereafter, at step 150, an etchant species may advantageously be flowed into the reaction chamber to etch a surface, such as the front surface, of wafer 10. The etchant species may be selected based upon the type of semiconductor material that forms the wafer 10. In embodiments in which the front surface 16 of a silicon wafer 10 is to be etched, one etchant species may be hydrogen chloride (HCl). Another etchant species is HF. The hydrogen chloride etch acts to remove at least some of the defects that usually exist in front surface 16. The etchant species may be introduced once the wafer 10 is at the higher temperature $T_1$, although the etchant species may be introduced at other temperatures or over a range of temperatures as shown in the embodiment of FIG. 6. In instances in which the etchant species is introduced once the reaction chamber has been brought to the higher temperature $T_1$, the etchant species may be introduced immediately upon the reaction chamber reaching the higher temperature $T_1$, i.e., at the point designed $X_1$, or at a somewhat later time once the reaction chamber has been maintained at the higher temperature for some period of time, such as after $X_1$ but before $X_2$, in one embodiment. In the embodiment depicted in FIG. 6, the wafer 10 is maintained at the elevated temperature for a period of time prior to introducing the etchant in order to bake the wafer as indicated by step 130, thereby effectively removing the native oxide. In addition, or alternatively, hydrogen may be flowed into the reaction chamber prior to introducing the etchant species, such as prior to time $X_3$ in the embodiment depicted in FIG. 6. At elevated temperatures, hydrogen acts to clean wafer 10 by removing impurities such as silicon dioxide from front surface 16. As such, hydrogen is introduced into the reaction chamber during the entire process beginning at time $T_0$ in one embodiment of the method.

The etchant may be introduced for various periods of time prior to commencement of the epitaxial growth. In the embodiment, however, the etchant is introduced for 7.5 seconds prior to beginning to grow the epitaxial layer. While the etchant, such as hydrogen chloride, renders the front surface 16 relatively defect-free, it is virtually impossible to provide an absolutely defect-free surface. Thus there will still typically be a plurality of defects in front surface 16 immediately prior to epitaxial layer growth. Because epitaxial growth occurs by individual atoms attaching to, and replicating, the underlying crystal structure, defects in the crystal structure of front surface 16 may be replicated in, and propagate through, an epitaxial layer grown on the front surface.

However, it has been observed that epitaxial growth on front surface 16 at a relatively high growth temperature and a relatively low growth rate acts to occlude at least some of the defects and prevent those defects from propagating through the epitaxial layer. Unfortunately, the growth rate to best achieve this occlusion effect is impractical for many mass production processes. The low growth rate causes a corresponding decrease in the throughput of the epitaxial reactor because a longer growth time is needed to obtain a desired epitaxial layer thickness. In addition, the longer growth time, as well as increased growth temperature, cause increased dopant diffusion into, or out of, the wafer, thereby generally increasing the transition width.

To obtain the defect occlusion effect of the high temperature, low growth rate process without sacrificing throughput or increasing transition width, the method employs a two-step epitaxial growth process. In this regard, an initial portion of the epitaxial layer 12 is grown on front surface 16 under the high temperature, low growth rate conditions necessary to occlude defects in the front surface. The remainder of the epitaxial layer 14 is then grown under high growth rate conditions, including in some embodiments at relatively low temperatures, to achieve the desired epitaxial layer thickness, while maintaining throughput and yield.

Thus, at step 160 and at time $X_4$ in the embodiment of FIG. 6, a first flow of source gas is flowed into the reaction chamber to grow an initial portion of the epitaxial layer on front surface 16 to cover defects in the front surface. While the flow of the etchant initiated at step 150 at a time $X_3$ in FIG. 6, may be halted prior to introducing the source gas, the etchant is advantageously continued with the source gas during the formation of the initial portion of the epitaxial layer, such as during the time period from $X_4$ to $X_5$ in the embodiment of FIG. 6 and as indicated by step 160 in FIG. 5, in order to compress the processing time and increase throughput. The source gas may be any of several suitable semiconductor source gases which are well known to those of skill in the art. For the deposition of silicon epitaxial layers, common silicon source gases include silane, dichlorosilane, trichlorosiliane and silicon tetrachloride. In addition, the source gas is commonly diluted by continuing to flow hydrogen into the reaction chamber simultaneously with the source gas. Further, a small flow of a suitable dopant gas may be flowed into the reaction chamber to provide a desired dopant concentration in the initial portion of the epitaxial layer.

The flow rate of the source gas is preferably controlled at a relatively low rate so that epitaxial growth is mass transfer rate limited (i.e., the growth rate is controlled by the flux of reactants reaching the surface of the substrate, rather than by the rate at which those reactants react and deposit upon the crystal lattice). It will be understood that the exact flow of source gas during growth of initial portion of the epitaxial layer 12 will vary depending on such factors as the growth temperature, the size and configuration of the chamber, and the partial pressure of any diluent gas and/or dopant gas.

In the embodiment depicted in FIG. 6, the first flow of source gas begins at time $X_4$. In one embodiment, the first flow of source gas is gradually ramped up from zero to a first flow rate beginning at $X_4$, rather than surging the source gas to the desired flow rate. The first flow of source gas continues until time $X_5$, which is selected to give the desired thickness of the initial portion of the epitaxial layer 12. In one embodiment, the initial portion of the epitaxial layer 12 is approximately 0.4 μm (microns) or less and may be deposited in about 7.5 seconds.

As shown, the introduction of the source gas advantageously overlaps with the etchant. Thus, both etching and epitaxial growth will occur simultaneously. As such, the combination of etching and epitaxial growth will produce a net-growth rate. This rate may be positive in that more material is being epitaxially deposited than is being etched, negative in that more material is being etched than is being epitaxially deposited or zero in which the same amount of material is being both etched and epitaxially deposited. It has been observed that this simultaneous etching and epitaxial growth further reduces the number of defects which propagate through the epitaxial layer. The flow of the etchant is preferably terminated after some period of overlap with the source gas, such as at $X_5$ in FIG. 6. While the period of overlap may vary, the period of overlap may be coextensive with the deposition of the initial portion of the epitaxial layer and is therefore also 7.5 seconds in one embodiment. Once terminated, the etchant is exhausted from the reaction chamber, typically while the epitaxial deposition process proceeds.

Figure 5:
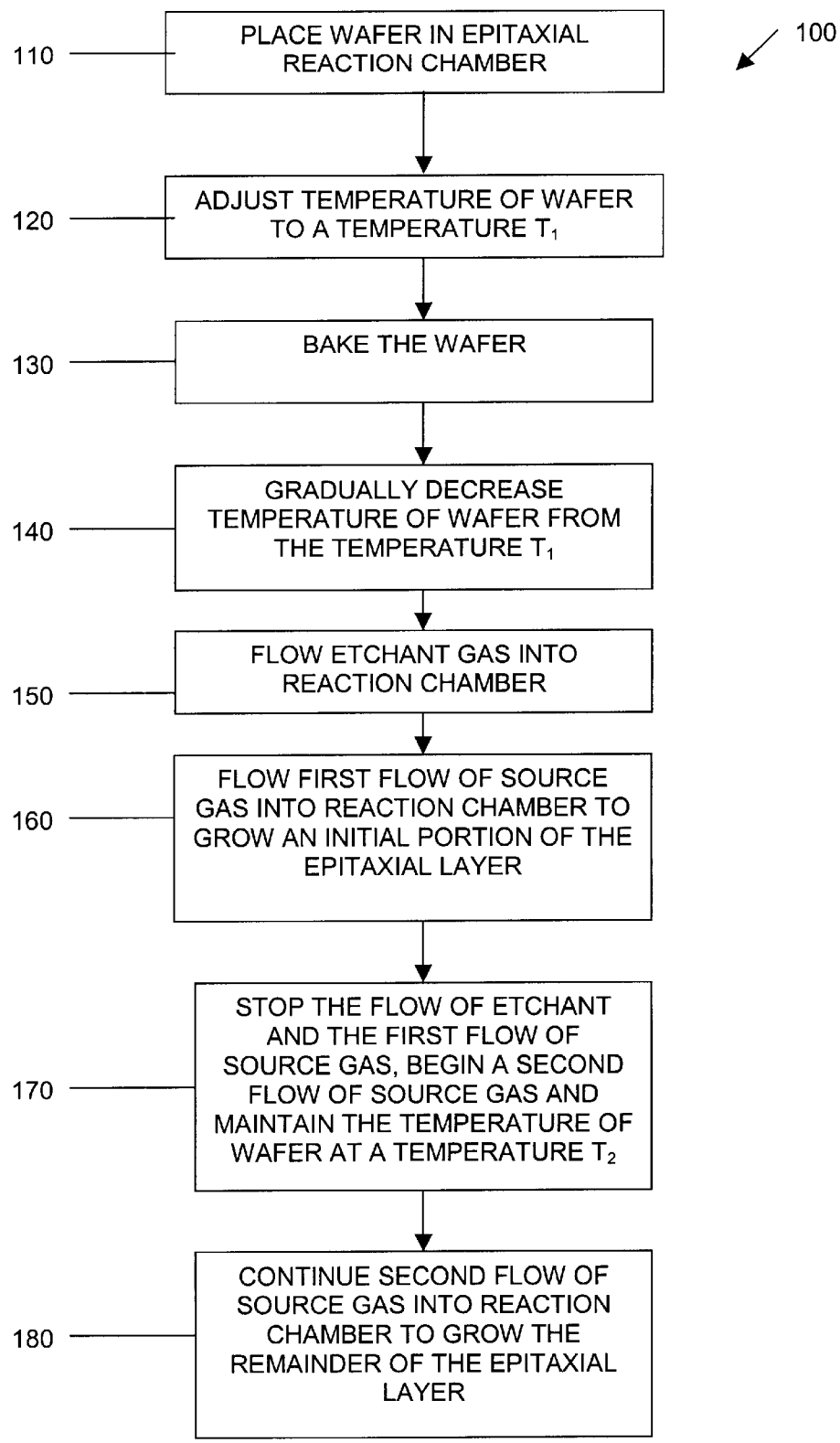
FIG. 5 is a flowchart illustrating a method of growing epitaxial semiconductor material with improved crystallographic properties according to one embodiment of the present invention.

In embodiments such as shown in FIGS. 5 and 6 in which the wafer 10 is initially baked, the epitaxial deposition of the epitaxial layer 12, and the etching of the front surface of the wafer, may be conducted at a lower temperature than that at which the wafer is baked. As shown in FIG. 6, at least a portion of or the entire epitaxial deposition of the initial portion of the epitaxial layer 12 may be conducted while the temperature is adjusted through a range of temperatures, all of which are suitable for the deposition of the epitaxial layer. In the illustrated embodiment, for example, the temperature at which the deposition of the initial portion of the epitaxial layer 12 is conducted decreases linearly during the entire deposition process. See Step 140 of FIG. 5. By way of example, in which the silicon wafer is baked at 1150° C., the temperature may be reduced beginning at $X_2$. The temperature is thereafter reduced during the etching process, i.e., between $X_3$ and $X_5$, and during the epitaxial deposition of initial portions of the epitaxial layer, i.e., between $X_4$ and $X_5$, to a temperature $T_2$ of 1050° C. While the temperature may be decreased at different rates, the temperature is linearly decreased from 1150° C. to 1050° C. in 20 seconds according to one embodiment. This embodiment has the advantage of maximizing throughput by combining the steps of growing the initial portions of the epitaxial layer 12 and adjusting the temperature of the wafer 10 from the higher temperature at which the substrate was baked to a lower temperature during deposition of the remainder of the epitaxial layer 14. As a result of the range of temperatures at which the initial portions of the epitaxial layer is deposited according to this embodiment, the growth rate of the initial portions of the epitaxial layer 12 may vary. However, in the embodiment in which the first flow of source gas is ramped up from zero, the decrease in growth rate associated with decreasing temperature will at least partially be offset by an increase in growth rate associated with increasing flow.

However, the temperature at which the initial portions of the epitaxial layer 12 is deposited need not be adjusted. As shown in an alternative embodiment depicted in FIG. 7, for example, the initial portion of the epitaxial layer 12 may be deposited at a constant temperature, such as the second temperature $T_2$, following a reduction in the temperature from $T_1$, at which the wafer is baked. The epitaxial deposition is typically performed at a constant temperature in instances in which less temperature reduction is required, i.e., the difference between $T_1$ and $T_2$ is smaller. For example, $T_1$ may be 1150° C. and $T_2$, may be 1100° C. in the embodiment depicted in FIG. 7. In any event, the initial portion of the epitaxial layer 12 is configured to act as a seed layer for the remainder of the epitaxial layer 14 by providing a crystal structure on which the remainder of the epitaxial layer can form that contains fewer defects than the surface 16 of the wafer 10. As shown in the embodiment of FIG. 7, the etchant may still be introduced while the temperature is being reduced, such as beginning at $X_3$, and continue during the deposition of the initial portion of the epitaxial layer, i.e., until $X_5$, in order to compress the processing cycle.

Following the deposition of the initial portion of the epitaxial layer 12, the remainder of the epitaxial layer 14 is deposited, as indicated by step 170 in FIG. 5. The method may incorporate a time delay between the deposition of the initial portion of the epitaxial layer 12 and the deposition of the remainder of the epitaxial layer 14. In this case, the flow of source gas would be terminated following the deposition of the initial portion of the epitaxial layer 12, i.e., at time $X_5$ in the embodiment of FIG. 6. Advantageously, however, the deposition of the remainder of the epitaxial layer 14 may commence with only a slight delay or, even more advantageously, immediately following the deposition of the initial portion of the epitaxial layer 12 at the time $X_5$. As such, the time required for depositing the entire epitaxial layer 12, 14 may be reduced, such as by 30 seconds, relative to other embodiments of the present invention that incorporate a delay during the deposition of the epitaxial layer, thereby further increasing the throughput and decreasing the cost of the deposition process.

In order to deposit the remainder of the epitaxial layer 14, a second flow of source gas is flowed into the epitaxial reaction chamber. The remainder of the epitaxial layer 14 is typically the layer in which integrated circuits will be formed. Therefore, control variables such as the second growth temperature, the flow rate of the source gas, and the flow rate of any dopant species will be selected to produce an epitaxial layer having the thickness and resistivity required by the particular integrated circuit manufacturing process.

The source gas may be any of several suitable semiconductor source gases which are well known to those skilled in the art. Although not necessary for the practice of the present invention, the source gas is typically the same source gas as that utilized to deposit the initial portion of the epitaxial layer 12. For the deposition of a silicon epitaxial layer, common silicon source gases include silane, dichlorosilane, trichlorosilane, and silicon tetrachloride. The source gas may be diluted, such as by continuing to flow hydrogen into the reaction chamber simultaneous with the source gas. In addition, a small flow of a suitable dopant gas may be introduced into the reaction chamber to provide a desired dopant concentration in the remainder of the epitaxial layer 14. The dopant concentration of the remainder of the epitaxial layer 14 is typically different than that of the wafer 10 to provide desired electrical characteristic necessary for integrated circuit manufacturing. The dopant gas may also be controlled such that both entire epitaxial layer 12,14 has substantially the same dopant concentration. However, in instances in which the thickness of initial portion of the epitaxial layer 12 is substantially less than the thickness of remainder of the epitaxial layer 14, the initial portion of the epitaxial layer may be completely contained within the transition region between wafer 10 and the remainder of the epitaxial layer. In that case, there is no need to match the dopant concentration of the initial portion of the epitaxial layer with the dopant concentration of the remainder of the epitaxial layer because diffusion is still the dominant doping characteristic in this region.

Typically, the source gas is gradually increased or ramped to the desired flow rate. In those advantageous embodiments in which the deposition of the remainder of the epitaxial layer 14 begins immediately following the deposition of the initial portion of the epitaxial layer 12 and in which the same type of source gas is utilized during the deposition of the entire epitaxial layer 12,14, the source gas is gradually increased or ramped up from the first flow rate utilized during the deposition of the initial portion of the epitaxial layer 12 to a second flow rate utilized during the deposition of the remainder of the epitaxial layer 14. As will be apparent during this embodiment, the second flow rate is greater than the first flow rate and, most commonly, is significantly greater than the first flow rate. In one embodiment, for example, the first flow of source gas is approximately 20 percent of the second flow of source gas. In contrast, the remainder of the epitaxial layer may be grown at a faster rate than the initial portions of the epitaxial layer even though the same flow rate is employed throughout the process in instances in which the flow of the etchant is terminated upon completing or shortly before completing the deposition of the initial portions of the eptitaxial layer. As such, the flow rate need not be increased during the grown of the remainder of the epitaxial layer relative to the growth of initial portions of the epitaxial layer.

As shown in FIGS. 6 and 7, for example, the temperature $T_2$ at which the remainder of the epitaxial layer is deposited may equal the temperature at which the etching and the deposition of the initial portion of the epitaxial layer are completed. As such, the remainder of the epitaxial layer 14 may be deposited at a constant temperature $T_2$ that is lower than that at which some of the initial portion of the epitaxial layer 12 was deposited. In any event, the second temperature $T_2$ is selected to provide an acceptable growth rate without causing excessive dopant diffusion into, or out of, the wafer as will be understood by those skilled in the art. In the foregoing embodiments, for example, the second temperature $T_2$ is 1100° C. or 1050° C. Alternatively, other temperatures may be used as required by the particular application.

Alternatively, the temperature of the reaction chamber may be gradually decreased or ramped downwardly from the temperature at which the initial portions of the epitaxial layer 12 is deposited to the second temperature with the deposition of the remainder of the epitaxial layer occurring both during the gradual decrease and at the constant second temperature, if so desired.

Advantageously, the growth rate of the remainder of the epitaxial layer 14 is at least as great and, more typically, significantly higher than that of the initial portion of the epitaxial layer 12 because the flow of etchant has terminated and/or the second flow of source gas is significantly higher than the first flow of source gas, as described above. The increased growth rate of the remainder of the epitaxial layer is particularly advantageous to increasing the throughput of the fabrication process since the remainder of the epitaxial layer 14 will generally be thicker than the initial portion of the epitaxial layer 12 to provide the epitaxial thickness necessary to receive integrated circuits. Most applications currently require the remainder of the epitaxial layer 14 having a thickness of approximately 2um or larger. Indeed, some high power applications require a remainder of the epitaxial layer 14 to have a thickness of 100 um or more. However, those of skill in the art will appreciate that as the sizes of integrated circuits continue to shrink the thickness required for the remainder of the epitaxial layer 14 will also shrink.

Once the remainder of the epitaxial layer 14 has been grown, the temperature of wafer 10 is usually ramped down to a nominal temperature as indicated by a dashed line in FIGS. 6 and 7 before the wafer is removed from the epitaxial chamber for further processing. During this ramp down process, the flow source gas may be terminated, as indicated by step 180 in FIG. 5 and as $X_6$ in FIGS. 6 and 7, and oxygen may be introduced to grow an oxide layer over the epitaxial layer for protection or the like, if desired. Alternatively, wafer 10 may undergo additional processing in the epitaxial reaction chamber.

In the above-described embodiments of the method of the present invention, the temperature was reduced from the relatively high temperature at which the wafer 10 was baked to remove the native oxide to a lower temperature at which at least some, if not all, of the epitaxial deposition was performed. In alternative embodiments, all, or at least a majority, of the processing operations may be performed at a constant temperature. In embodiments in which a relatively thick epitaxial layer is desired, such as epitaxial layer of three or more microns, the entire process is generally conducted at a relatively high temperature, such as 1150° C. In this regard, the temperature of the reactor chamber may be increased from a nominal temperature to an elevated temperature, such as 1150° C. The wafer is then baked, such as for about 0–60 seconds, in order to remove the native oxide. Thereafter, an etchant is introduced and a first flow of source gas is introduced, either concurrent with the etchant or somewhat delayed relative to the introduction of the etchant. In any event, the etchant and the first flow of source gas are generally provided in a concurrent manner for at least a period of time as described above. After forming the initial portion of the epitaxial layer 12, the etchant and the first flow of source gas may be terminated and a second flow of source gas is provided, typically at a flow rate greater than that at which the first flow of source gas was provided, to permit the relatively rapid deposition of the remainder of the epitaxial layer 14. While the rate of epitaxial deposition will vary, the deposition rate is relatively rapid, such as four microns per minute, ten microns per minute or greater.

In another embodiment in which the epitaxial layer need not be as thick, such as an epitaxial layer having a thickness of two to three microns or less, the elevated temperature at which the deposition occurs need not be as high. For example, following placement of the wafer 10 in the reaction chamber, the temperature may be increased to an elevated temperature of 1000° C. or the like. The native oxide is then removed and the front surface of the wafer is cleaned by exposure to an etchant, such as hydrofluoric acid. Thereafter, the flow of hydrofluoric acid is eliminated and another etchant, such as hydrochloric acid, is introduced followed by the first and second flows of source gas as described above in order to deposit the epitaxial layer, albeit at first and second growth rates as also described above. Thereafter, the reaction chamber may be cooled and if a protection layer is desired, oxygen may be provided in order to grow an oxide layer over the epitaxial layer.

While the invention has been described above in the context of growing epitaxial layers 12, 14 on the front surface 16 of a wafer 10, it will be appreciated that the invention is also applicable to growing epitaxial layers on the back surface 18. Thus epitaxial layers 12, 14 may be grown on either the front surface 16 or the back surface 18, or alternatively, epitaxial layers 12, 14 may be grown on both the front and back surfaces 16, 18 as required by the particular application.

Many modifications and other embodiments of the inventions set forth herein will come to mind to one skilled in the art to which these inventions pertain having the benefit of the teachings presented in the foregoing descriptions and the associated drawings. For example, both the pre-epitaxial oxide removal and the post-epitaxial oxide deposition may occur within or exterior to the epitaxial chamber. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method of forming an epitaxial semiconductor layer on a semiconductor substrate, the method comprising:
   etching the semiconductor substrate, wherein etching the semiconductor substrate comprises flowing an etchant over the semiconductor substrate;
   growing the epitaxial layer on the semiconductor substrate at a first growth rate while continuing the flow of the etchant so as to etch at least one of the semiconductor substrate and the epitaxial layer, wherein growing the epitaxial layer comprises introducing a source gas in addition to the etchant; and
   continuing to grow the epitaxial layer at a second growth rate that exceeds the first growth rate after at least reducing the etching of at least one of the semiconductor substrate and the epitaxial layer.

2. A method according to claim 1 further comprising etching at least one of the semiconductor substrate and the epitaxial layer while initially growing the epitaxial layer.

3. A method according to claim 2 wherein etching further comprises etching the semiconductor substrate prior to initially growing the epitaxial layer.

4. A method according to claim 1 further comprising maintaining the semiconductor substrate at a constant temperature during said etching and growing steps.

5. A method according to claim 1 further comprising reducing the temperature of the semiconductor substrate during at least a portion of said etching step.

6. A method according to claim 5 further comprising maintaining the temperature of the semiconductor substrate at a constant temperature during the initial and continued growth of the epitaxial layer following the reduction of the temperature during at least a portion of said etching step.

7. A method according to claim 5 wherein growing the epitaxial layer at the first growth rate comprises at least initially growing the epitaxial layer while reducing the temperature of the semiconductor substrate.

8. A method according to claim 1 wherein continuing to grow the epitaxial layer comprises increasing a flow rate of a source gas relative to said the flow rate of the source gas during the growth of the epitaxial layer at the first growth rate.

9. A method according to claim 1 further comprising removing oxide from the semiconductor substrate prior to etching the semiconductor substrate.

10. A method according to claim 9 wherein removing oxide from the semiconductor substrate comprises baking the semiconductor substrate.

11. A method according to claim 9 wherein removing oxide from the semiconductor substrate comprises exposing the semiconductor substrate to an etchant containing HF.

12. A method according to claim 1 further comprising growing an oxide layer upon the epitaxial layer following completion of the continued growth of the epitaxial layer.

13. A method of forming an epitaxial semiconductor layer on a semiconductor substrate, the method comprising:
    initially growing an epitaxial layer of semiconductor material on a surface of the semiconductor substrate at a first growth rate; and
    continuing to grow the epitaxial layer of semiconductor material at a second growth rate higher than the first growth rate and at a temperature lower than a temperature that at least a portion of the epitaxial layer is initially grown,
    wherein at least a portion of the epitaxial layers is grown as the temperature decreases over time.

14. A method according to claim 13 wherein initially growing the epitaxial layer comprises initially growing at least a first portion of the epitaxial layer as the temperature decreases over time.

15. A method according to claim 14 wherein initially growing the epitaxial layer comprises reducing the temperature during the entire initial growth of the epitaxial layer.

16. A method according to claim 13 wherein continuing to grow the epitaxial layer comprises increasing a flow rate of a source gas relative to said the flow rate of the source gas during the initial growth of the epitaxial layer.

17. A method according to claim 13 further comprising etching the semiconductor substrate prior to initially growing the epitaxial layer.

18. A method according to claim 13 further comprising etching the semiconductor substrate while initially growing the epitaxial layer.

19. A method according to claim 13 further comprising removing oxide from the semiconductor substrate prior to initially growing the epitaxial layer.

20. A method according to claim 19 wherein removing oxide from the semiconductor substrate comprises baking the semiconductor substrate.

* * * * *